(12) United States Patent
Kawashima et al.

(10) Patent No.: US 7,395,477 B2
(45) Date of Patent: Jul. 1, 2008

(54) SWITCH CONTROL APPARATUS, SEMICONDUCTOR DEVICE TEST APPARATUS AND SEQUENCE PATTERN GENERATING PROGRAM

(75) Inventors: Hiroyuki Kawashima, Tokyo (JP);
Kazushige Yamamoto, Tokyo (JP);
Satoshi Shimoyama, Tokyo (JP)

(73) Assignee: Avantest Corporation, Tokyo (JP)

( * ) Notice: Subject to any disclaimer, the term of this patent is extended or adjusted under 35 U.S.C. 154(b) by 488 days.

(21) Appl. No.: 11/089,053

(22) Filed: Mar. 24, 2005

(65) Prior Publication Data

US 2006/0208767 A1      Sep. 21, 2006

(30) Foreign Application Priority Data

Mar. 25, 2004      (JP)      .............................. 2004-089022

(51) Int. Cl.
*G01R 31/28*      (2006.01)
(52) U.S. Cl. ....................................... 714/738; 714/734
(58) Field of Classification Search ........................ None
See application file for complete search history.

(56) References Cited

U.S. PATENT DOCUMENTS 6,711,314 B1 *  3/2004  Mori et al. ..................... 385/17
6,815,992 B1 * 11/2004  Ng et al. ....................... 327/199

FOREIGN PATENT DOCUMENTS

GB            2261748 A    *  5/1993

OTHER PUBLICATIONS

NN8206146 IBM_TDB VLSI Switching-Circuit Failure Testing. Jun. 1982.*

* cited by examiner

*Primary Examiner*—Cynthia Britt

(57) ABSTRACT

A switch control apparatus for controlling a switch is provided, the switch control apparatus including: a sequence memory for recording a sequence pattern, which includes open/close instruction data which instruct the switch thereon to open/close; an address control module for sequentially retrieving each of the open/close instruction data of the sequence pattern from the sequence memory; and an open/close state storage module for storing an open/close state instructed by changed open/close instruction data, when the open/close instruction data retrieved by the address control module is changed, wherein the open/close state stored by the open/close state storage module is provided to the switch such that the switch opens or closes in response to the open/close state.

10 Claims, 12 Drawing Sheets

| ADDRESS | DATA | IN1 | IN2 | A | B | OPEN/CLOSE STATE |
|---|---|---|---|---|---|---|
| #0 | 0 | | ⎍ | L | L | |
| #1 (0ms) | 0 | | | L | L | × |
| #2 (1ms) | 1 | | | H | L | H |
| #3 (2ms) | 0 | | | L | H | L |
| #4 (3ms) | 0 | | | L | L | L |

| ADDRESS | DATA | IN1 | IN2 | A | B | OPEN/CLOSE STATE |
|---|---|---|---|---|---|---|
| #0 | 0 | | ⎍ | L | L | |
| #1 (0ms) | 0 | | | L | L | × |
| #2 (1ms) | 0 | | | L | L | × |
| #3 (2ms) | 0 | | | L | L | × |
| #4 (3ms) | 0 | | | L | L | × |

# SWITCH CONTROL APPARATUS, SEMICONDUCTOR DEVICE TEST APPARATUS AND SEQUENCE PATTERN GENERATING PROGRAM

This patent application claims priority from a Japanese patent application No. 2004-089022 filed on Mar. 25, 2004, the contents of which are incorporated herein by reference.

BACKGROUND OF THE INVENTION

1. Field of the Invention

The present invention relates to a switch control apparatus, a semiconductor testing apparatus, and a machine readable medium storing thereon a generating program. More particularly, the present invention relates to a switch control apparatus, a semiconductor testing apparatus, and a machine readable medium storing thereon a generating program for controlling timing of opening and closing a switch.

2. Description of the Related Art

A number of semiconductor switches are provided in a circuit used for a semiconductor testing apparatus. Order and timing of opening and closing the switches are predetermined and if opening and closing are conducted against the order and timing, sometimes the semiconductor testing apparatus or a semiconductor under test is broken down. For example, if a number of switches are open all at once, sometimes the semiconductor under test is damaged by spike voltage.

Therefore, conventionally, for each semiconductor switch, a technique to provide a sequence circuit which is a logic circuit for controlling timing of opening and closing of the semiconductor switch is used.

However, in case of frequently repeat of opening and closing of the switch being required, a logic circuit constituting the sequence circuit becomes complicated. Further, for every testing apparatus for performing a different testing, an exclusive sequence circuit should be prepared. Further, when it is required to maintain the position of the switch to be opened or closed for a while after a testing is started, even if it is a case where the switch same is to be controlled about the same examination, a different kind of control is sometimes required according to an open/close state predetermined before the testing is started. Thus, sometimes the sequence circuit becomes more complicated.

Accordingly, it is an object to make a program for writing sequence of instructing open or close of a switch on a sequence memory and make the contents of a testing easily changed by rewriting the sequence memory, without composing a sequence circuit by a logic circuit.

SUMMARY OF THE INVENTION

Therefore, it is an object of the present invention to provide a switch control apparatus, a semiconductor testing apparatus, and a machine readable medium storing thereon a generating program, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a switch control apparatus for controlling a switch, includes a sequence memory for recording a sequence pattern includes open/close instruction data which instruct to open/close the switch thereon; an address control module for sequentially retrieving each of the open/close instruction data of the sequence pattern from the sequence memory; and an open/close state storage module for storing an open/close state instructed by changed open/close instruction data when the open/close instruction data retrieved by the address control module is changed, wherein the switch opens or closes in response to the open/close state stored by the open/close state storage module.

Further, the open/close state storage module may hold the open/close state stored before a first open/close instruction data is retrieved, while the same data as the first open/close instruction data is consecutively retrieved from the time when the first open/close instruction data of the sequence pattern is retrieved.

Further, the sequence memory may store a plurality of sequence patterns, the address control module may retrieve each of the open/close instruction data of the plurality of sequence patterns, and the open/close state storage module may hold the open/close state instructed by the last open/close instruction data of another one of the sequence patterns retrieved before one of the sequence patterns is retrieved, while the same data as the first open/close instruction data is consecutively retrieved from the time when the first open/close instruction data of the one of the sequence patterns is retrieved.

Further, the open/close state storage module may include: a first flip-flop for storing the open/close instruction data retrieved by the address control module; a second flip-flop for storing the open/close instruction data retrieved by the address control module before the open/close instruction data stored by the first flip-flop; a third flip-flop for storing the open/close state instructed by the open/close instruction data retrieved by the address control module in case the open/close instruction data stored by the first and second flip-flops are different, and the switch may open or close in response to the open/close state stored by the third flip-flop.

Further, the address control module may store the first open/close instruction data of the sequence pattern in both of the first and second flip-flops.

Further, the address control module may retrieve the first open/close instruction data of the sequence pattern within a shorter time than that for the second or later open/close instruction data and stores them in both of the first and second flip-flops.

According to the second aspect of the present invention, a semiconductor test apparatus for testing a device under test by providing an electric power to each part of the device under test sequentially, includes: a plurality of switches for controlling an electric power input to or output from the device under test; a first sequence memory for storing a sequence pattern includes open/close instruction data which instructs to open/close the switch for each switch; a first address control module for sequentially retrieving each of the open/close instruction data of each of the plurality of sequence patterns from the first sequence memory; and a first open/close state storage module provided for each switch for storing an open/close state instructed by changed open/close instruction data when the open/close instruction data, which instructs to open/close the switch, retrieved by the first address control module is changed, wherein each of the plurality of switches opens or closes in response to the open/close state stored by the first open/close state storage module provided for each switch.

According to the second aspect of the present invention, a semiconductor test apparatus for testing a device under test by providing electric power to each part of the device under test sequentially, includes: a plurality of switches for controlling an electric power input to or output from the device under test; a first sequence memory for storing a sequence pattern includes open/close instruction data which instructs the switch to open/close; a first address control module for sequentially retrieving each of the open/close instruction data of each of the plurality of sequence patterns from the first sequence memory; and a first open/close state storage module provided for each switch for storing an open/close state instructed by changed open/close instruction data when the open/close instruction data, which instructs the switch to open/close, retrieved by the first address control module is changed, wherein each of the plurality of switches opens or closes in response to the open/close state stored by the first open/close state storage module provided for each switch.

Further, the semiconductor test apparatus may further include: a second sequence memory for storing a sequence pattern includes open/close instruction data, which instructs to open/close other switch than the plurality of switches; a second address control module for sequentially retrieving each of the open/close instruction data of the sequence pattern from the second sequence memory in case an open/close state stored on the first open/close state storage module is changed; and a second open/close state storage module for storing an open/close state instructed by changed open/close instruction data in case the open/close instruction data, which instructs to open/close the other switch, retrieved by the second address control module is changed, wherein the other switch may open or close in response to the open/close state stored by the second open/close state storage module provided for each of the other switch.

According to the third aspect of the present invention, a machine readable medium storing thereon a computer program for generating a sequence pattern includes open/close instruction data, which instructs to open/close a switch, output from a switch control apparatus to the switch, is provided, the computer program generating a sequence pattern includes an open/close instruction data, which is different from an open/close instruction data output when the open/close state storage module starts opening or closing the switch, as an open/close instruction data output until the open/close state storage module starts opening or closing the switch from the time when the address control module starts retrieving the open/close instruction data of the sequence data, wherein the switch control apparatus includes: a sequence memory for recording a sequence pattern includes open/close instruction data which instructs to open/close the switch thereon; an address control module for sequentially retrieving each of the open/close instruction data of the sequence pattern from the sequence memory; and an open/close state storage module for storing an open/close state instructed by changed open/close instruction data when the open/close instruction data retrieved by the address control module is changed.

According to the third aspect of the present invention, a machine readable medium storing thereon a computer program for generating a sequence pattern includes open/close instruction data, which instructs a switch to open/close, output from a switch control apparatus to the switch, is provided, the computer program generating a sequence pattern includes an open/close instruction data, which is different from an open/close instruction data output when the open/close state storage module starts opening or closing the switch, as an open/close instruction data output until the open/close state storage module starts opening or closing the switch from the time when the address control module starts retrieving the open/close instruction data of the sequence data, wherein the switch control apparatus includes: a sequence memory for recording a sequence pattern includes open/close instruction data which instructs the switch thereon to open/close; an address control module for sequentially retrieving each of the open/close instruction data of the sequence pattern from the sequence memory; and an open/close state storage module for storing an open/close state instructed by changed open/close instruction data when the open/close instruction data retrieved by the address control module is changed.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
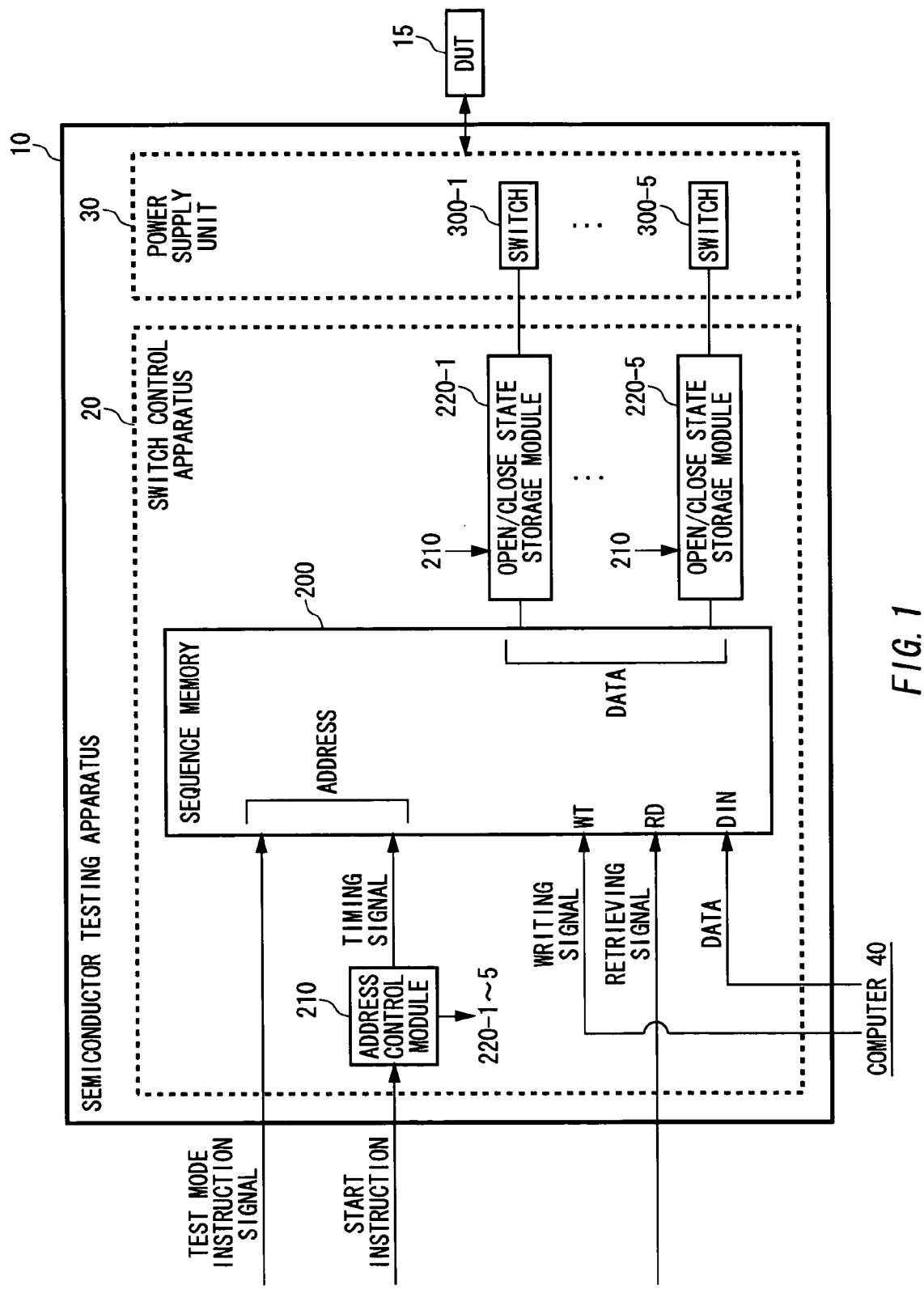
FIG. 1 is a block diagram of a semiconductor testing apparatus.

FIG. 1 is a block diagram of a semiconductor testing apparatus 10. The semiconductor testing apparatus 10 includes a switch control apparatus 20 and a power supply unit 30, controls an open/close state of a plurality of switches provided in the semiconductor testing apparatus 10, switches connection between the semiconductor testing apparatus 10 and a device under test 15 ("DUT") to test the DUT 15. The switch control apparatus 20 includes a sequence memory 200, an address control module 210, and open/close state storage modules 220-1 to 5.

The sequence memory 200 is for example, a RAM or a ROM, on which a sequence pattern comprising open/close instruction data for instructing each of switches 300-1 to 5 to open/close is recorded. Further, the sequence memory 200 is provided with a test mode instruction signal for instructing a test mode as a part of an address input (for example, most significant bit) and a timing signal of the test mode as another part of the address input (for example, least significant bit). The sequence memory 200 receives them and outputs the sequence pattern recorded thereon to the open/close state storage modules 220-1 to 5.

When the address control module 210 receives a start instruction, it outputs a signal for initializing each of the open/close state storage modules 220-1 to 5 to the open/close state storage module. Then, the address control module 210 inputs the timing signal to an address input of the sequence memory 200 at a predetermined output interval and thus retrieves sequentially the open/close instruction data of the sequence pattern.

Each of the open/close state storage modules 220-1 to 5 is provided to correspond to each of the switches 300-1 to 5 and initializes the state on the basis of the signal input from the address control module 210. Then, in case the open/close instruction data retrieved by the address control module 210 changes, each of the open/close state storage modules 220-1 to 5 stores the open/close state instructed by the changed open/close instruction data.

The power supply unit 30 includes the switches 300-1 to 5, for example, semiconductor switches. Each of the switches 300-1 to 5 opens or closes in response to the open/close state stored by the corresponding open/close state storage module 220 and thus controls electric power input to or output from the DUT 15. Further, although the structure where the power supply unit 30 includes five switches is described according to the present example, the power supply unit 30 may include less than or more than five switches and, for example, switches as many as bit width of the data output from the sequence memory 200.

Figure 2:
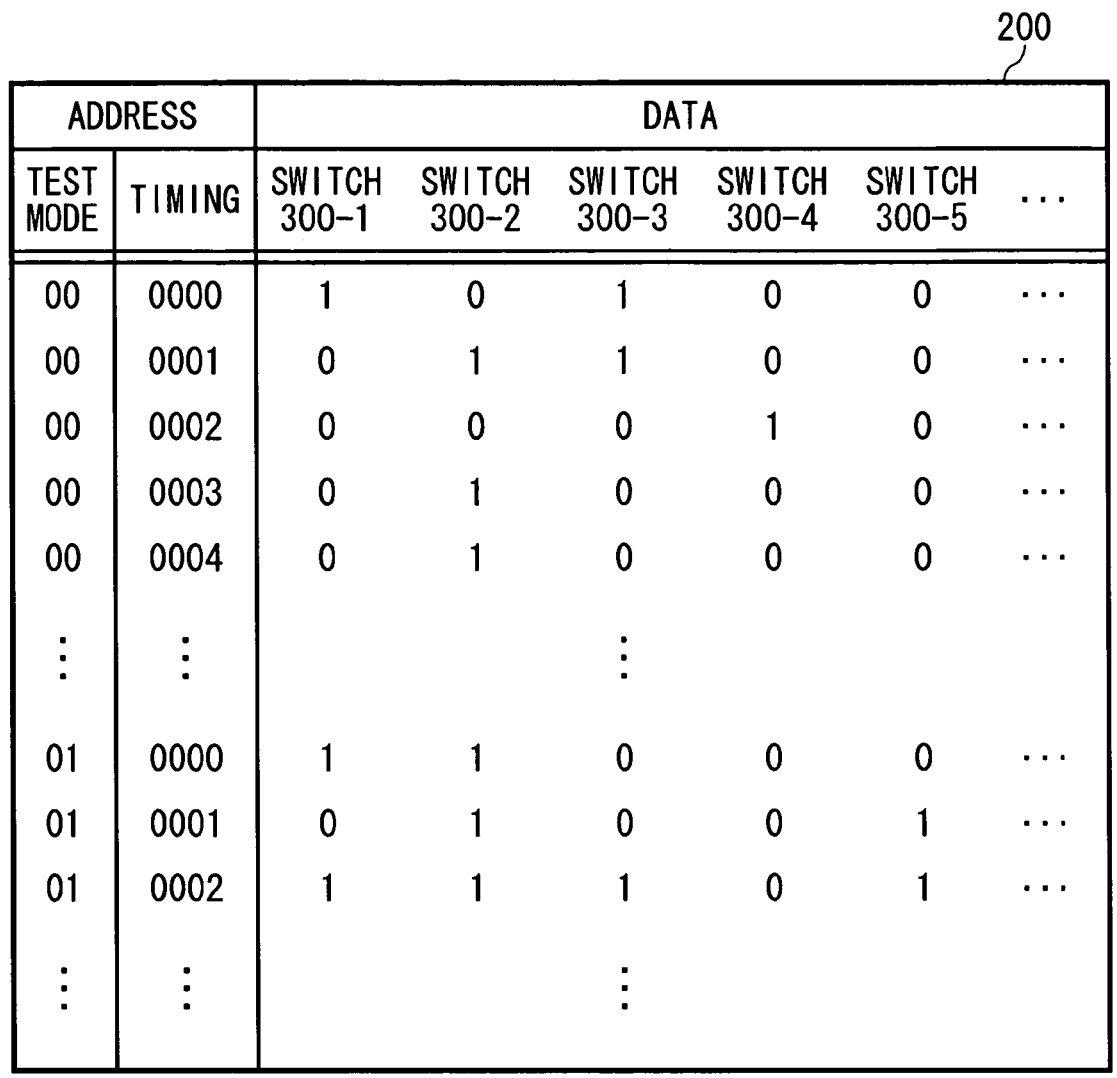
FIG. 2 shows an example of data structure of a sequence memory.

FIG. 2 shows an example of data structure of the sequence memory 200. The sequence memory 200 stores the open/close instruction data for instructing each of the switches 300-1 to 5 to open/close in an address determined by a combination of the test mode instruction signal and the timing signal. For example, for a test mode of which identifier is zero, an first open/close instruction data of the sequence pattern corresponding to the switch 300-1 is one to instruct the switch 300-1 to open.

Then, a second open/close instruction data is zero to instruct the switch 300-1 to close. Here, since the timing signal changes regularly as time elapses, in case the second open/close instruction data is output when the testing is started, a third open/close instruction data is output in a predetermined reference time (for example, 1 ms) after the testing is started.

Here, the test mode indicates the kind of the testing on a semiconductor. As an example of the test mode, the semiconductor testing apparatus 10 may measure current output from the DUT 15 by applying a predetermined voltage to the DUT 15, and, as another example, the semiconductor testing apparatus 10 may measure potential generated in a part of the DUT 15 by inputting a predetermined current to the DUT 15. As such, the sequence memory 200 stores the sequence data for every test mode for testing the DUT 15.

Figure 3:
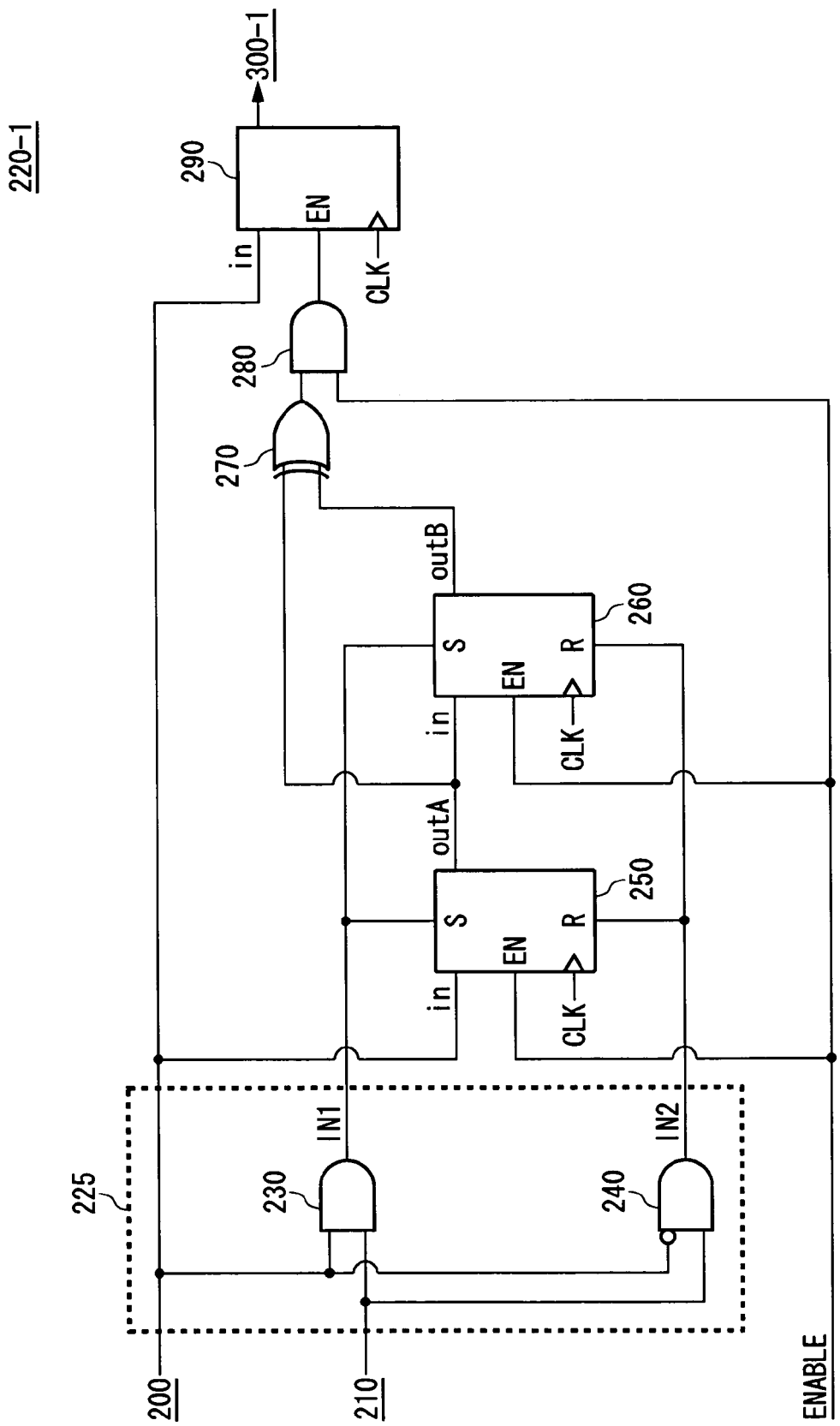
FIG. 3 is a block diagram of an open/close state storage module.

FIG. 3 is a block diagram of the open/close state storage module 220-1. The open/close state storage module 220-1 includes a logic circuit for initialization of a flip-flop 225, a first flip-flop 250, a second flip-flop 260, an EXOR circuit 270, an AND circuit 280, and a third flip-flop 290. In case a signal for instructing to initialize the open/close state storage module 220-1 is input from the address control module 210, the logic circuit 225 make the open/close instruction data input from the sequence memory 200 stored on both the flip-flop 250 and the flip-flop 260.

Specifically, the logic circuit 225 includes an AND circuit 230 for setting the flip-flop 250 and the flip-flop 260 by AND between the open/close instruction data input from the sequence memory 200 and the signal for instructing to initialize the open/close state storage module 220-1. Further, the logic circuit 225 includes an AND circuit 240 for setting the flip-flop 250 and the flip-flop 260 by AND between NOT of a logic value showing the open/close instruction data input from the sequence memory 200 and a logic vale of the signal for instructing to initialize the open/close state storage module 220-1.

The flip-flop 250 stores the open/close instruction data retrieved by the address control module 210 from the sequence memory 200. Further, the flip-flop 260 stores the open/close instruction data retrieved by the address control module 210 from the sequence memory 200 prior to the open/close instruction data stored by the flip-flop 250. The EXOR circuit 270 compares the open or close data stored on the flip-flops 250 and 260.

In case where the open/close instruction data compared by the EXOR circuit 270 are different and operation of the open/close state storage module 220-1 is enable, the AND circuit 280 enables the flip-flop 290. Thus, the flip-flop 290 stores the open/close state instructed by the open/close instruction data retrieved from the sequence memory 200 by the address control module 210. Here, the open/close state is, for example, one, which is a logic value showing a state where the switch 300-1 is open, or zero, which is a logic value showing a state where the switch 300-1 is closed. As a result, the switch 300-1 opens or closes in response to the open/close state stored by the flip-flop 290.

Further, each of the open/close state storage modules 220-2 to 5 controls an open/close state of each of the switches 300-2 to 5 instead of the open/close state storage modules 220-1 controlling the open/close state of the switch 300-1. Description of the other configuration will be omitted because the configuration is substantially the same as that of the open/close state storage module 220-1.

Figure 4A:
FIG. 4 shows an example of a process for controlling a switch by a switch control apparatus.
Figure 4B:
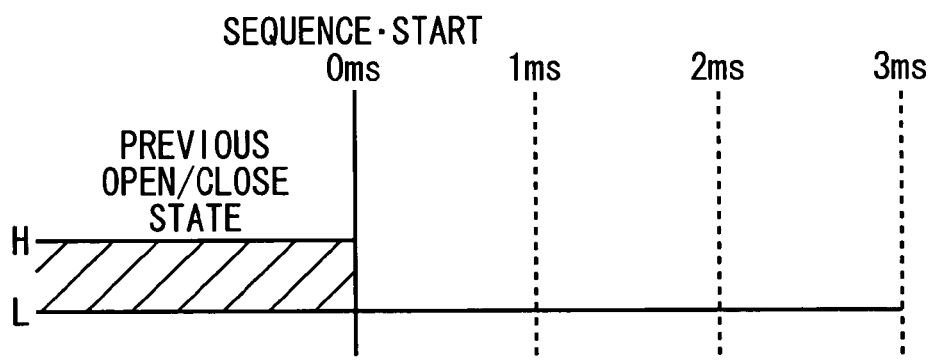

FIG. 4 shows an example of a process for controlling the switch 300-1 by the switch control apparatus 20. FIG. 4A shows a process of change in the open/close state stored on the open/close state storage module 220-1 according to the timing signals sequentially output from the address control module 210. FIG. 4B shows a time-series change in the logic value showing the open/close state stored on the open/close state storage module 220-1. By using the drawings, it is described the process of the switch control apparatus 20 controlling the open/close state of the switch 300-1 according to a combination of the test mode instruction signal and the timing signal.

First, the address control module 210 makes a first open/close instruction data of the sequence pattern stored on both the flip-flops 250 and 260. Therefore, both the outputs of the flip-flops 250 and 260 become H (high potential). Then, the address control module 210 retrieves a second open/close instruction data. As a result, the flip-flops 250 and 260 store the second open/close instruction data and the first open/close instruction data, respectively.

Since the open/close instruction data stored on the flip-flops 250 and 260 are different, the flip-flop 290 stores the open/close state instructed by the second open/close instruction data. As a result, the open/close state storage module 220-1 stores L (low potential) showing that the switch 300-1 is to be closed as the open/close state of the switch 300-1, and the switch 300-1 is closed. Then, in case the address control module 210 retrieves each of third to fifth open/close instruction data, the open/close state storage module 220-1 holds the open/close state showing the second open/close instruction data because the open/close instruction data is not changed.

Figure 5A:
FIG. 5 shows an example of a process for controlling a switch by the switch control apparatus.
Figure 5B:
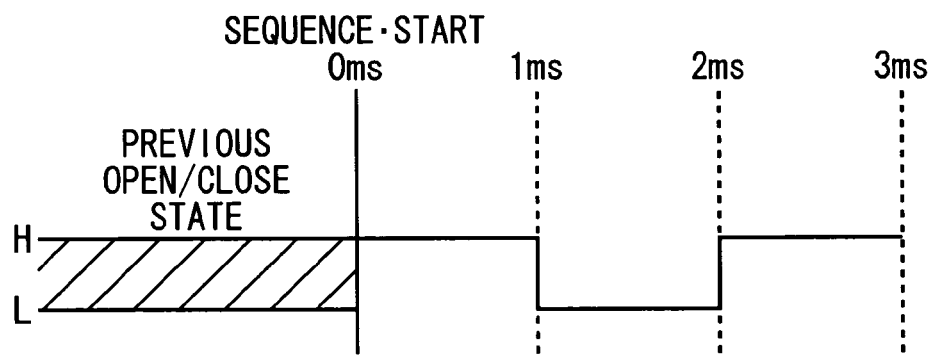

FIG. 5 shows an example of a process for controlling the switch 300-2 by the switch control apparatus 20. FIG. 5A shows a process of change in the open/close state stored on the open/close state storage module 220-2 according to the timing signals sequentially output from the address control module 210. FIG. 5B shows a time-series change in the logic value showing the open/close state stored on the open/close state storage module 220-2. By using the drawings, it is described the process of the switch control apparatus 20 controlling the open/close state of the switch 300-2 according to a combination of the test mode instruction signal and the timing signal.

First, the address control module 210 makes a first open/close instruction data of the sequence pattern stored on both the flip-flops 250 and 260. Therefore, both the outputs of the flip-flops 250 and 260 become H (high potential). Then, the address control module 210 retrieves a second open/close instruction data. As a result, the flip-flops 250 and 260 store the second open/close instruction data and the first open/close instruction data, respectively.

Since the open/close instruction data stored on the flip-flops 250 and 260 are different, the flip-flop 290 stores the open/close state instructed by the second open/close instruction data. As a result, the open/close state storage module 220-2 stores H (high potential) showing that the switch 300-2 is to be open as the open/close state of the switch 300-2, and the switch 300-2 is open.

Then, in case the address control module 210 retrieves a third open/close instruction data, the open/close state storage module 220-2 stores the open/close state showing the third open/close instruction data because the open/close instruction data is changed. Further, in case the address control module 210 retrieves a fourth open/close instruction data, the open/close state storage module 220-2 stores the open/close state showing the fourth open/close instruction data because the open/close instruction data is changed. Then, in case the address control module 210 retrieves a fifth open/close instruction data, the open/close state storage module 220-2 stores the open/close state showing the fourth open/close instruction data because the open/close instruction data is not changed.

Figure 6A:
FIG. 6 shows an example of a process for controlling a switch by the switch control apparatus.
Figure 6B:
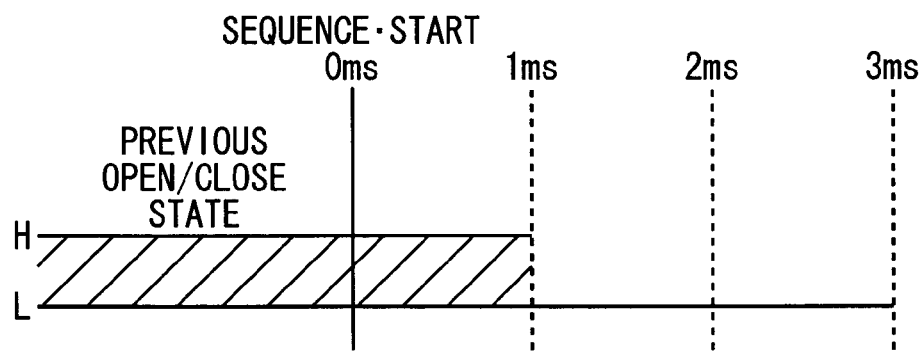

FIG. 6 shows an example of a process for controlling the switch 300-3 by the switch control apparatus 20. FIG. 6A shows a process of change in the open/close state stored on the open/close state storage module 220-3 according to the timing signals sequentially output from the address control module 210. FIG. 6B shows a time-series change in the logic value showing the open/close state stored on the open/close state storage module 220-3. By using the drawings, it is described the process of the switch control apparatus 20 controlling the open/close state of the switch 300-3 according to a combination of the test mode instruction signal and the timing signal.

First, the address control module 210 makes a first open/close instruction data of the sequence pattern stored on both the flip-flops 250 and 260. Therefore, both the outputs of the flip-flops 250 and 260 become H (high potential). Then, the address control module 210 retrieves a second open/close instruction data. As a result, the flip-flops 250 and 260 store the second open/close instruction data and the first open/close instruction data, respectively.

Since the open/close instruction data stored on the flip-flops 250 and 260 are the same, the flip-flop 290 holds the open/close state stored before the first open/close state instruction data is retrieved. As a result, the open/close state storage module 220-3 holds the open/close state of the switch 300-3 as before. Since it is unclear whether the previous open/close state is H (high potential) or L (low potential), the previous open/close state is indicated by x.

Then, the address control module 210 retrieves a third open/close instruction data. As a result, the flip-flop 250 and 260 store the third open/close instruction data and the second open/close instruction data, respectively. Since the open/close instruction data stored on the flip-flops 250 and 260 are different, the flip-flop 290 stores the open/close state instructed by the third open/close instruction data. As a result, the open/close state storage module 220-3 stores L (low potential) showing that the switch 300-3 is to be closed as the open/close state of the switch 300-3, and the switch 300-3 is closed.

Then, in case of the address control module 210 retrieving each of a fourth and a fifth open/close instruction data, the open/close state storage module 220-1 holds the open/close state showing the third open/close instruction data because the open/close instruction data is not changed.

Figures 7A, 7B:
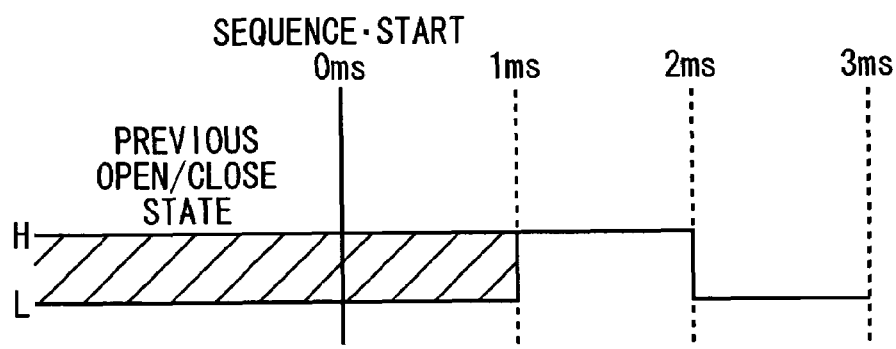
FIG. 7 shows an example of a process for controlling a switch by the switch control apparatus.

FIG. 7 shows an example of a process for controlling the switch 300-4 by the switch control apparatus 20. FIG. 7A shows a process of change in the open/close state stored on the open/close state storage module 220-4 according to the timing signals sequentially output from the address control module 210. FIG. 7B shows a time-series change in the logic value showing the open/close state stored on the open/close state storage module 220-4. By using the drawings, it is described the process of the switch control apparatus 20 controlling the open/close state of the switch 300-4 according to a combination of the test mode instruction signal and the timing signal.

First, the address control module 210 makes a first open/close instruction data of the sequence pattern stored on both the flip-flops 250 and 260. Therefore, both the outputs of the flip-flops 250 and 260 become L (low potential). Then, the address control module 210 retrieves a second open/close instruction data. As a result, the flip-flops 250 and 260 store the second open/close instruction data and the first open/close instruction data, respectively.

Since the open/close instruction data stored on the flip-flops 250 and 260 are the same, the flip-flop 290 holds the open/close state stored before the first open/close state instruction data is retrieved. As a result, the open/close state storage module 220-4 holds the open/close state of the switch 300-4 as before. Since it is unclear whether the previous open/close state is H (high potential) or L (low potential), the previous open/close state is indicated by x.

Then, the address control module 210 retrieves a third open/close instruction data. As a result, the flip-flop 250 and 260 store the third open/close instruction data and the second open/close instruction data, respectively. Since the open/close instruction data stored on the flip-flops 250 and 260 are different, the flip-flop 290 stores the open/close state instructed by the third open/close instruction data. As a result, the open/close state storage module 220-4 stores H (high potential) showing that the switch 300-4 is to be open as the open/close state of the switch 300-4, and the switch 300-4 is open.

Figures 8A, 8B:
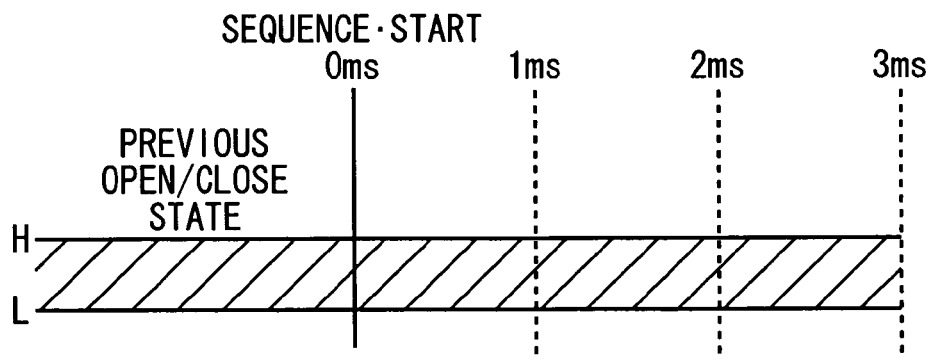
FIG. 8 shows an example of a process for controlling a switch by the switch control apparatus.

FIG. 8 shows an example of a process for controlling the switch 300-5 by the switch control apparatus 20. FIG. 8A shows a process of change in the open/close state stored on the open/close state storage module 220-5 according to the timing signals sequentially output from the address control module 210. FIG. 8B shows a time-series change in the logic value showing the open/close state stored on the open/close state storage module 220-5. By using the drawings, it is described the process of the switch control apparatus 20 controlling the open/close state of the switch 300-5 according to a combination of the test mode instruction signal and the timing signal.

First, the address control module 210 makes a first open/close instruction data of the sequence pattern stored on both the flip-flops 250 and 260. Therefore, both the outputs of the flip-flops 250 and 260 become L (low potential). Then, the address control module 210 retrieves a second open/close instruction data. As a result, the flip-flops 250 and 260 store the second open/close instruction data and the first open/close instruction data, respectively.

Since the open/close instruction data stored on the flip-flops 250 and 260 are the same, the flip-flop 290 holds the open/close state stored before the first open/close state instruction data is retrieved. As a result, the open/close state storage module 220-5 holds the open/close state of the switch 300-5 as before. Since it is unclear whether the previous open/close state is H (high potential) or L (low potential), the previous open/close state is indicated by x.

Similarly in the following, even in case the address control module 210 retrieves each of third to fifth open/close instruction data, the flip-flop 290 holds the open/close state of the switch 300-5 as before because the open or close data is not changed.

As described with respect to FIGS. 4 to 8 in the above, only in case the open/close instruction data retrieved by the address control module 210 is changed, the open/close state storage modules 220-1 to 5 (referred to "open/close state storage module 220", collectively) store the open/close state instructed by the changed open/close instruction data. In the meantime, while the same data as the first open/close instruction data is consecutively retrieved from the time when the first open/close instruction data of the sequence pattern is retrieved, the open/close state storage module 220 holds the open/close state stored before the first open/close instruction data is retrieved.

Thus, the open/close state storage module 220 can maintain an open/close state of the switch instructed by the last open/close instruction data of a sequence pattern retrieved prior to the sequence pattern while a predetermined period passes from the time when retrieval of the sequence data is started. In other words, if open/close instruction data same as a first open/close instruction data are consecutively stored a predetermined number of times, even if the test mode is changed, it is possible to hold the open/close state of the switch instructed by the last open/close instruction data of a sequence pattern before the change. In the meantime, if a first open/close instruction data is different from a second open/close instruction data, it is possible to switch the switch immediately at the time when the testing is started without holding the previous open/close state.

In addition, by generating a first open/close instruction data instructing an open/close state different from that of the time when open or close is to be started, it is possible to set the switch to be a predetermined state immediately at the time when the open or close is to be started. In other words, as shown in the above, the first open/close instruction data of the test pattern does not instruct an open/close state of any switch and is used to control the open/close state by the second open/close instruction data. Therefore, preferably, the address control module 210 may retrieve the first open/close instruction data of a test pattern of the sequence memory 200 within a shorter time than that for the second or later open/close instruction data and make it stored on the flip-flops 250 and 260. Thus, it is possible to conduct the testing more quickly.

Figure 9:
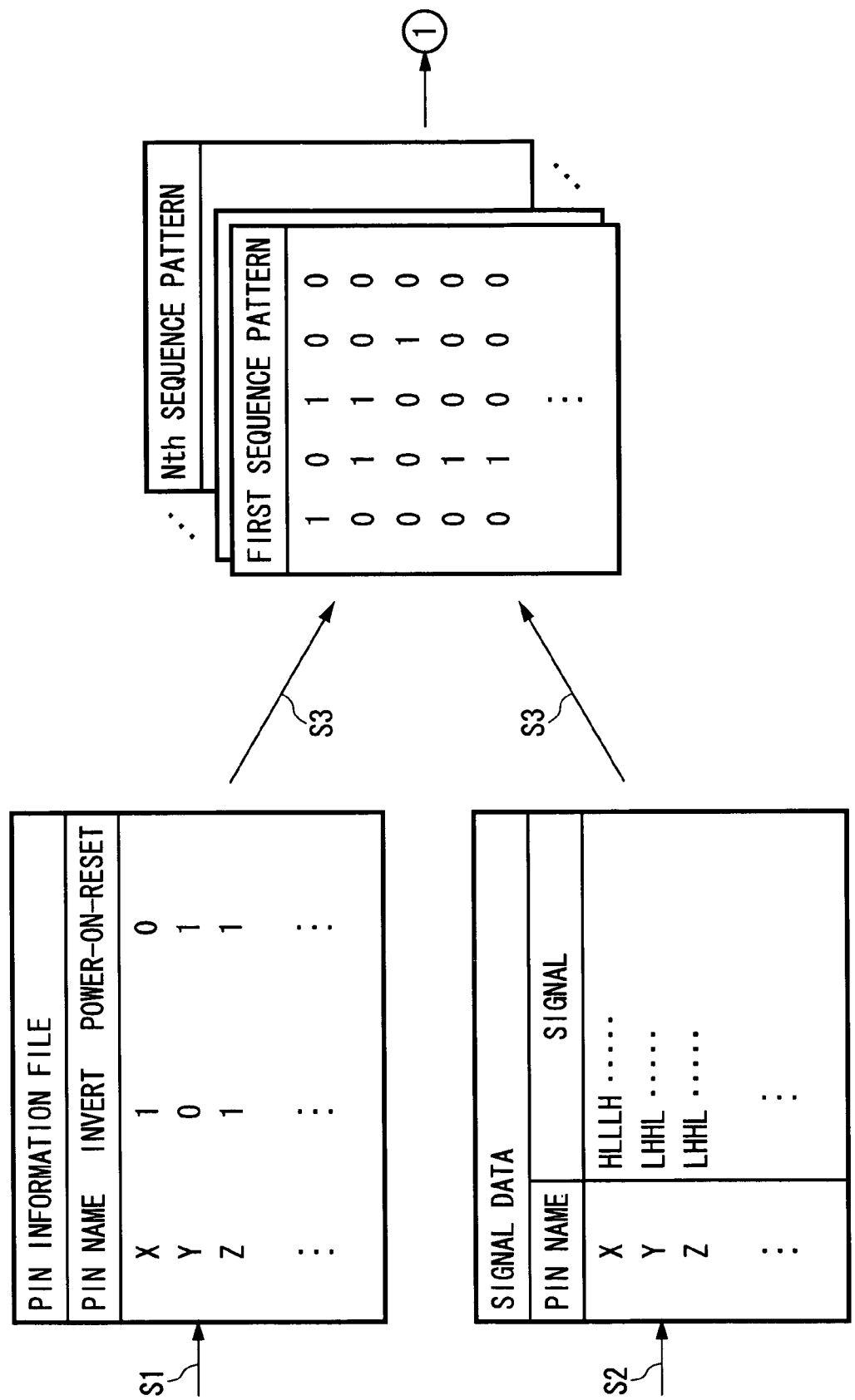
FIG. 9 shows a process of a generating program generating a sequence pattern by a computer.

FIG. 9 shows a process of a generating program generating a sequence pattern by the computer 40. The generating program makes the computer 40 operate and thus acquires a predetermined PIN information file (S1). For every pin for controlling each switch, the PIN information file includes an INVERT information showing whether a logic value of a signal input to the pin is positive or negative logic and a POWER-ON-RESET information showing whether the switch is open or closed when the semiconductor testing apparatus 10 starts to operate.

Then, the generating program makes the computer 40 operate and thus generate a signal data (S2). The signal data is a data recording a logic value of a signal output to each pin for controlling each switch. As a specific example of the process, the generating program may generate the signal data from a simulation result of control sequence of the power supply unit 30.

Then, the generating program makes the computer 40 operate and thus generates a first to an nth sequence patterns corresponding to different test modes on the basis of the PIN information file and the signal data (S3). Specifically, first, the generating program generates open/close instruction data from the time when open or close is started and to the time when the open or close is finished for each switch. Then, the generating program generates data different from the open/close state of the time when the open or close is started as open/close instruction data output from the time when the address control module 210 starts to retrieve the open/close instruction data of the sequence pattern to the time when the open/close state storage module 220-1 starts to open/close the switch. Thus, it is possible to hold the state of the switch from the time when the retrieval of the sequence pattern is started to the time when the open or close the switch is started and start to open/close the switch immediately at the time when the switch is to be open or closed.

Figure 10:
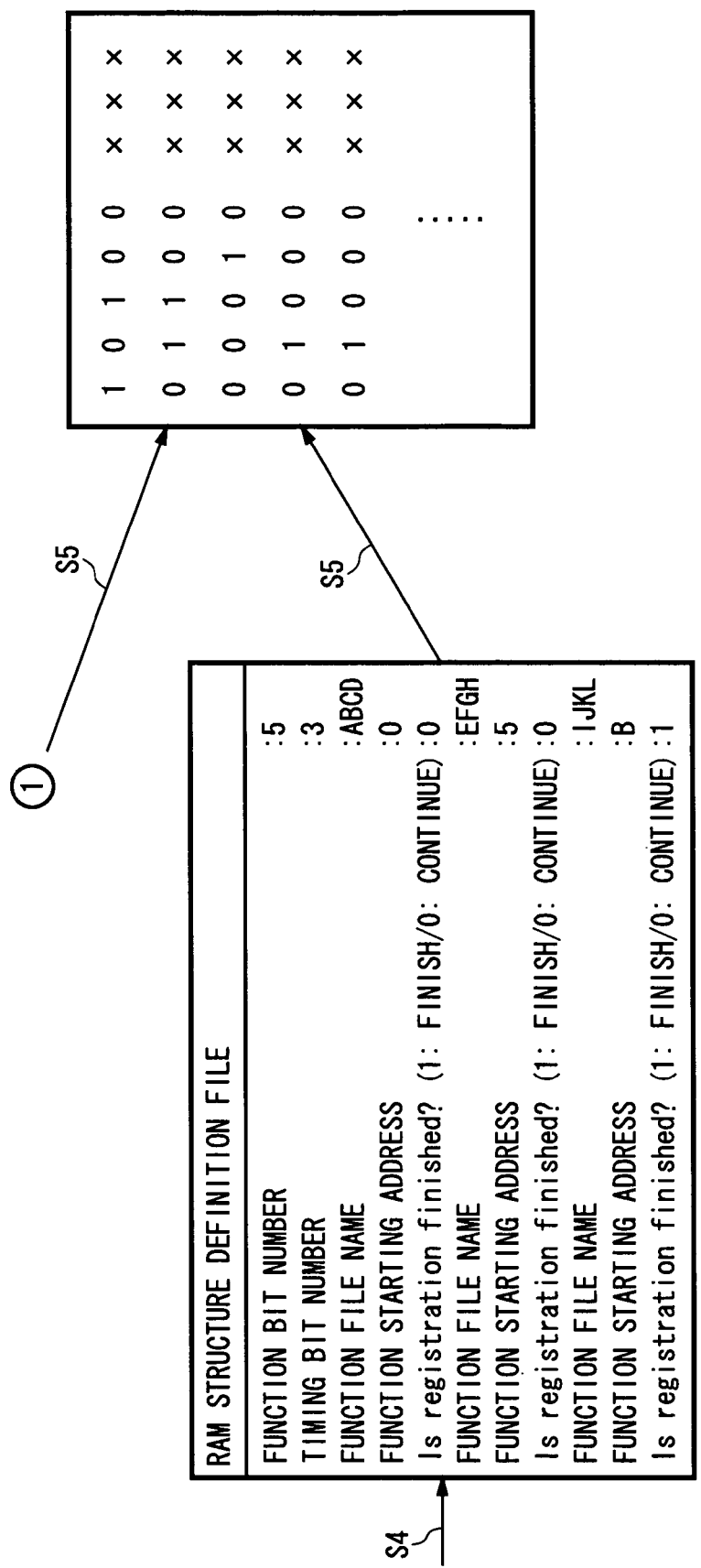
FIG. 10 shows a consecutive process of FIG. 9.

FIG. 10 shows a process continued from FIG. 9. The generating program makes the computer 40 operate and thus generates a RAM structure definition file for making the first to nth sequence patterns stored on predetermined addresses in the sequence memory 200 (S4). For example, a file name and bit numbers of the test mode instruction signal and the timing signal of each sequence pattern may be input to the generating program and the generating program may generate a memory image to be stored on the sequence memory 200 on the basis of them. Thus, the generating program can dispose each of the first to nth sequence patterns to an address determined by a combination of the test mode and the timing signal and records it on the sequence memory 200 (S5).

Figure 11:
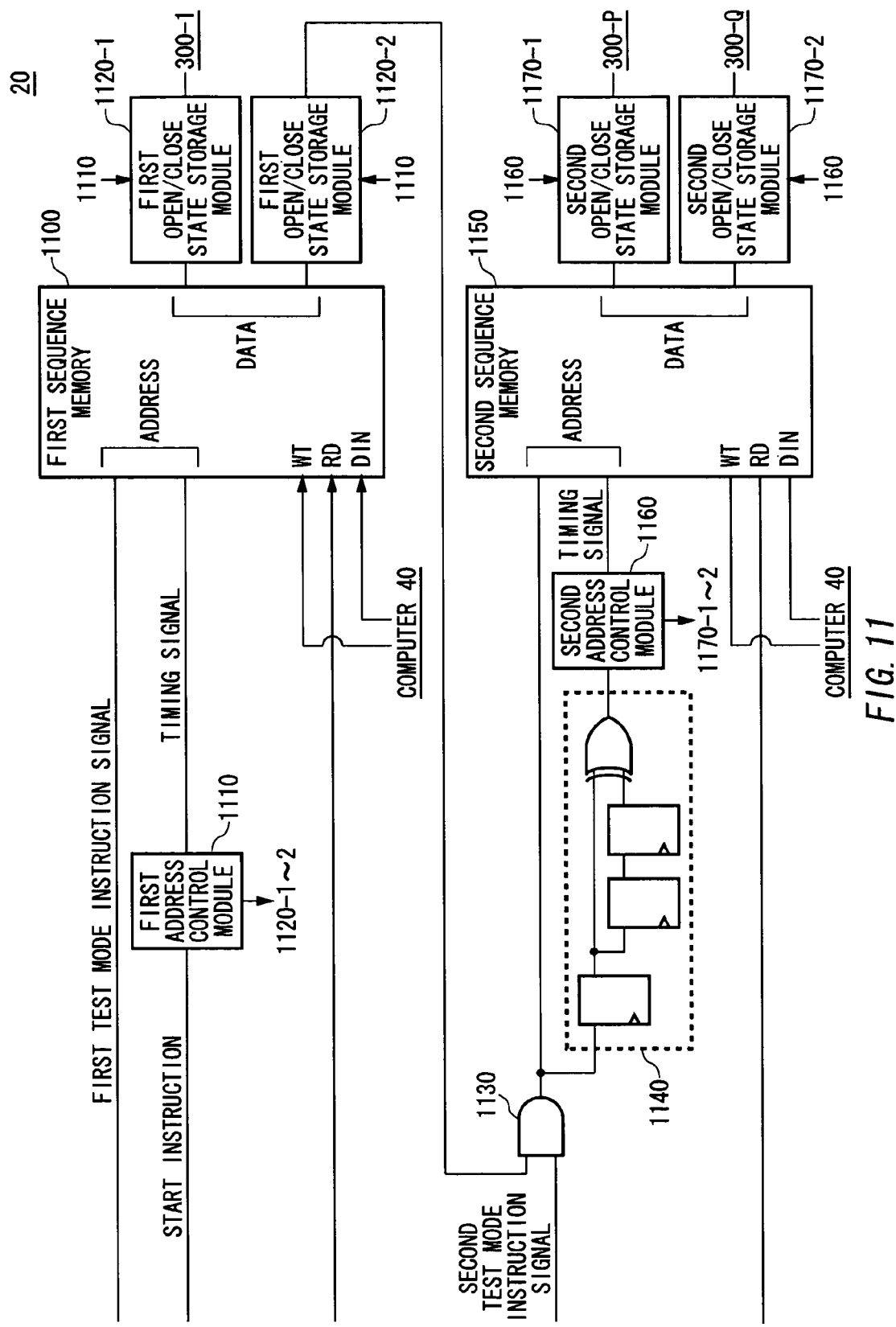
FIG. 11 is a block diagram of the switch control apparatus 200 according to an alternative example.

FIG. 11 is a block diagram of the switch control apparatus 20 according to an alternative example. According to the present alternative example, an example of a second sequence memory start to operate in response to an open or close signal of a switch output from a first sequence memory is described. The switch control apparatus 20 includes a first sequence memory 1100, a first address control module 1110, first open/close state storage modules 1120-1 to 2, an AND circuit 1130, a logic circuit 1140, a second sequence memory 1150, a second address control module 1160, and second open/close state storage modules 1170-1 to 2.

The sequence memory 1100 records a sequence pattern comprising open/close instruction data of each of the open/close state storage modules 1120-1 and 1120-2, which instruct to open/close the switch, thereon. Then, a first test mode instruction data for instructing a test mode is input as a part of an address input (for example, most significant bit) and a timing signal of the instructed test mode as another part of the address input (for example, least significant bit) to the sequence memory 1100. The sequence memory 1100 outputs the recorded sequence pattern to the open/close state storage modules 1120-1 and 1120-2.

The address control module 1110 receives a start instruction and outputs a signal for initializing each of the open/close state storage modules 1120-1 and 1120-2 to the open/close state storage module. Then, the address control module 1110 inputs the timing signal to an address input of the sequence memory 1100 at a predetermined output interval and thus retrieves sequentially the open/close instruction data of the sequence pattern.

The open/close state storage module 1120-1 is provided to correspond to the switch 300-1 and initializes the state on the basis of the signal input from the address control module 1110. Then, in case the open/close instruction data retrieved by the address control module 1110 changes, the open/close state storage module 1120-1 stores the open/close state instructed by the changed open/close instruction data.

The open/close state storage module 1120-2 initializes the state on the basis of the signal input from the address control module 1110. Then, in case the open/close instruction data retrieved by the address control module 1110 changes, the open/close state storage module 1120-2 stores the open/close state instructed by the changed open/close instruction data.

The AND circuit 1130 outputs an AND between a second test mode instruction signal and the open/close state stored on the open/close state storage module 1120-2. In other words, for example, in case a high potential (H) is input as the second test mode instruction signal, the AND circuit 1130 changes the output signal when the open/close state stored on the open/close state storage module 1120-2 changes H (high potential) to L (low potential) or L (low potential) to H (high potential). Further, in case the open/close state stored on the open/close state storage module 1120-2 is H (high potential), the AND circuit 1130 changes the output signal when the second test mode instruction signal changes. In addition, in this case, the AND circuit 1130 inputs the test mode instruction signal to an address input of the sequence memory 1150.

The logic circuit 1140 makes the address control module 1160 begin to operate in case the output signal output from the AND circuit 1130 changes, for example, the open/close state stored on the open/close state storage module 1120-2 changes. The sequence memory 1150 records a sequence pattern comprising open/close instruction data instructing to open/close switches other than the switch 300-1, for example switches 300-P and 300-Q, thereon.

If the address control module 1160 receives the signal from the logic circuit 1140 and begins to operate, first, the address control module 1160 initializes the open/close state storage modules 1170-1 and 1170-2. Then, the address control module 1160 inputs the timing signal to an address input of the sequence memory 1150 at a predetermined output interval and thus retrieves sequentially the open/close instruction data of the sequence pattern from the sequence memory 1150.

The open/close state storage module 1170-1 is provided to correspond to the switch 300-P. The open/close state storage module 1170-2 is provided to correspond to the switch 300-Q. Then, each of the open/close state storage modules 1170-1 and 1170-2 initializes the state on the basis of the signal input from the address control module 1160.

In case the open/close instruction data retrieved from the sequence memory 1150 by the address control module 1160 changes, each of the open/close state storage modules 1170-1 and 1170-2 stores the open/close state instructed by the changed open/close instruction data. As a result, the switches 300-P and 300-Q open or close in response to the open/close states stored by the open/close state storage modules 1170-1 and 1170-2, respectively.

As above, according to the alternative example, the switches 300-P and 300-Q are controlled by the open/close instruction data recorded on the sequence memory 1150 during sequence where the switch 300-1 is controlled by the open/close instruction data recorded on the sequence memory 1100. Therefore, the switch control apparatus 20 can perform a testing as a subroutine during performing another testing.

Figure 12:
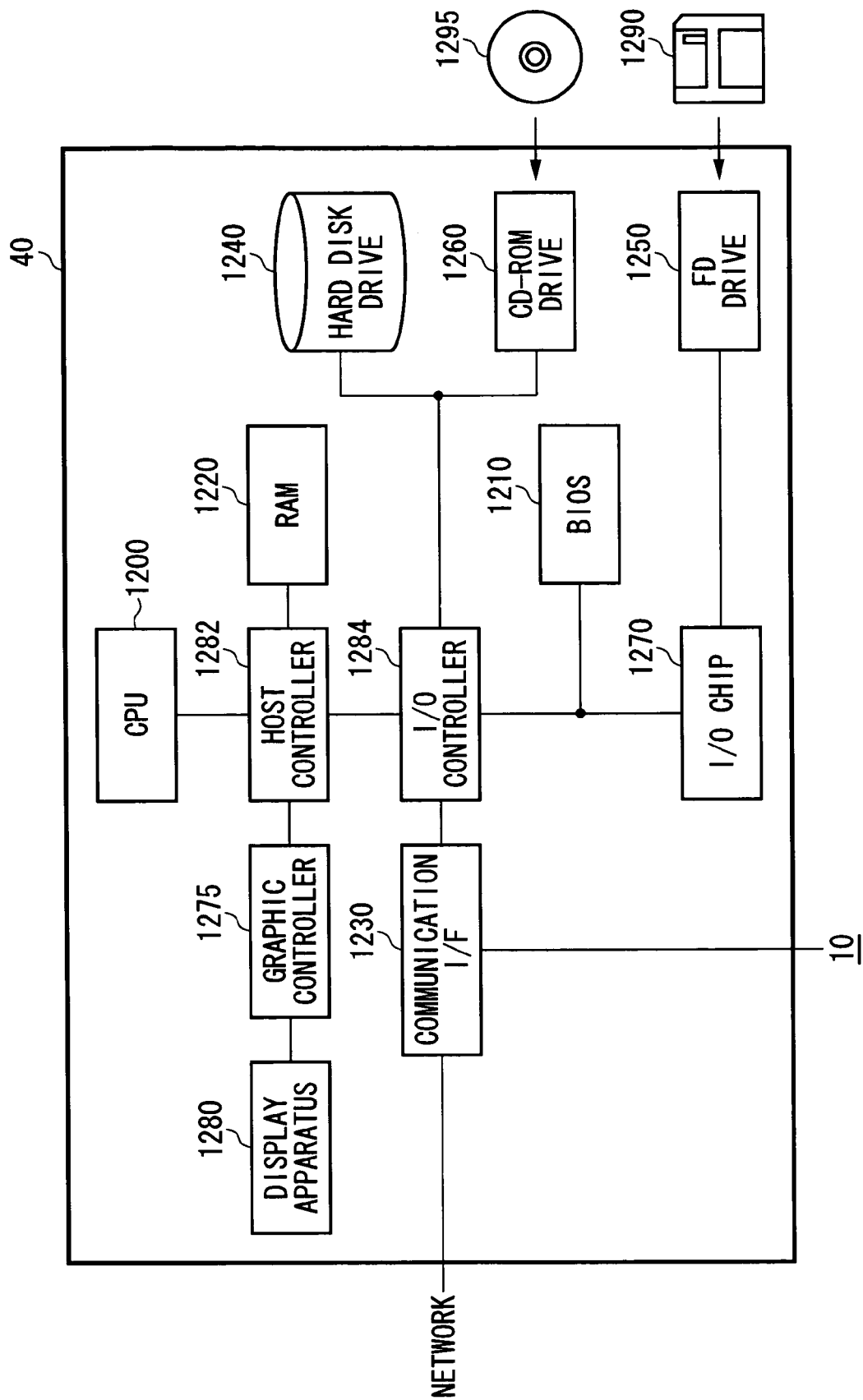
FIG. 12 shows an example of the hardware configuration of the computer 40.

FIG. 12 shows an example of the hardware configuration of the computer 40. The computer 40 includes a CPU peripheral part comprising a CPU 1200, a RAM 1220, a graphic controller 1275, and a display apparatus 1280 which are connected with each other by a host controller 1282, an input and output part comprising a communication interface 1230 connected to the host controller 1282 by an input and output controller 1284 ("I/O controller 1284"), a hard disk drive 1240, and a CD-ROM drive 1260, and a legacy input and output part comprising a BIOS 1210 connected to the I/O controller 1284, a flexible disk drive 1250, and an input and output chip 1270 ("I/O chip 1270").

The host controller 1282 connects the RAM 1220 with the CPU 1200 having access to the RMA 1220 at a high transmission rate and the graphic controller 1275. The CPU 1200 operates and performs control of each part on the basis of programs stored on the BIOS 1210 and the RAM 1220. The graphic controller 1275 acquires an image data generated by the CPU 1200 and the like on a frame buffer provided in the RAM 1220 and displays it on the display apparatus 1280. Instead, the graphic controller 1275 may include a frame buffer storing an image data generated by the CPU 1200 and the like, therein.

The I/O controller 1284 connects the host controller with the communication interface 1230, which is a relatively high-speed I/O apparatus, the hard disk drive 1240, and the CD-ROM drive 1260. The communication interface 1230 communicates with an apparatus of the outside via a network. Further, the communication interface 1230 communicates with the semiconductor testing apparatus 10. The hard disk drive 1240 stores a program and data used by the computer 40. The CD-ROM drive 1260 retrieves a program or data from a CD-ROM 1295 and provides the I/O chip 1270 via the RAM 1220 with it.

Further, the I/O controller is connected with the BIOS 1210 and a relatively low-speed I/O apparatus such as the flexible disk drive 1250 and the I/O chip 1270. The BIOS 1210 stores a program executed by the CPU 1200 when the computer 40 starts to operate, a program depending on hardware of the computer 40, and the like. The flexible disk drive 1250 retrieves a program or data from a flexible disk 1290 and provides the I/O chip 1270 via the RAM 1220 with it. The I/O chip 1270 connects the flexible disk drive 1290 with various I/O apparatus via a parallel port, a serial port, a keyboard port, a mouse port, and the like.

A program is stored on a recording medium such as the flexible disk 1290, the CD-ROM 1295, or an IC-card and provided to the computer 40 by a user. The program retrieved from the recording medium via the I/O chip 1270 and/or the I/O controller 1284 is installed in the computer 40 and executed. Description on process of the generating program installed in the computer 40 and executed making the computer 40 operate is omitted because it is the same as the process by the computer 40 described with respect to FIGS. 9 and 10.

The program described above may be stored on a recording medium of the outside. An optical recoding medium such as a DVD, a PD, etc., a magneto-optical recording medium such as an MD, a tape medium, a magnetic recoding medium, and a semiconductor memory such as an IC card can be used as the recoding medium in addition to the flexible disk 1290 and the CD-ROM 295. Further, a storing apparatus such as a hard disk or a RAM provided in a server system connected with a dedicated communication network and Internet may be used as the recording medium and may provide the computer 40 with the program through the network.

According to the present invention, it is possible to properly control timing of opening and closing a switch by a circuit of simple constitution.

Although the present invention has been described by way of exemplary embodiments, it should be understood that those skilled in the art might make many changes and substitutions without departing from the spirit and the scope of the present invention which is defined only by the appended claims.

What is claimed is:

1. A switch control apparatus for controlling a switch, comprising:
a sequence memory for recording a sequence pattern comprising open/close instruction data which instruct said switch thereon to open/close;
an address control module for sequentially retrieving each of the open/close instruction data of the sequence pattern from said sequence memory; and
an open/close state storage module for storing an open/close state instructed by changed open/close instruction data, when the open/close instruction data retrieved by said address control module is changed,
wherein the open/close state stored by said open/close state storage module is provided to the switch such that the switch opens or closes in response to the open/close state.

2. A switch control apparatus as claimed in claim 1, wherein said open/close state storage module holds the open/close state stored before a first open/close instruction data is retrieved, while the same data as the first open/close instruction data is consecutively retrieved from the time when the first open/close instruction data of the sequence pattern is retrieved.

3. A switch control apparatus as claimed in claim 2, wherein said sequence memory stores a plurality of sequence patterns, said address control module retrieves each of the open/close instruction data of the plurality of sequence patterns, and said open/close state storage module holds the open/close state instructed by the last open/close instruction data of another one of the sequence patterns retrieved before one of the sequence patterns is retrieved, while the same data as the first open/close instruction data is consecutively retrieved from the time when the first open/close instruction data of the one of the sequence patterns is retrieved.

4. A switch control apparatus as claimed in claim 1, wherein said open/close state storage module comprises: a first flip-flop for storing the open/close instruction data retrieved by the address control module; a second flip-flop for storing the open/close instruction data retrieved by said address control module before the open/close instruction data stored by said first flip-flop; and a third flip-flop for storing the open/close state instructed by the open/close instruction data retrieved by said address control module in case the open/close instruction data stored by said first and second flip-flops are different, and said switch opens or closes in response to the open/close state stored by said third flip-flop.

5. A switch control apparatus as claimed in claim 4, wherein said address control module stores the first open/close instruction data of the sequence pattern in both of said first and second flip-flops.

6. A switch control apparatus as claimed in claim 5, wherein said address control module retrieves the first open/close instruction data of the sequence pattern within a shorter time than that for the second or later open/close instruction data and stores them in both of said first and second flip-flops.

7. A semiconductor test apparatus for testing a device under test by providing electric power to each part of said device under test, comprising:
a plurality of switches for controlling an electric power input to or output from said device under test;
a first sequence memory for storing a sequence pattern comprising open/close instruction data which instructs said switch to open/close;
a first address control module for sequentially retrieving each of the open/close instruction data of each of the plurality of sequence patterns from said first sequence memory; and
a first open/close state storage module, provided for each of the plurality of switches, for storing an open/close state instructed by changed open/close instruction data, when the open/close instruction data, which instructs said switch to open/close, retrieved by said first address control module is changed,
wherein the open/close state stored by said first open/close state storage module is provided to each of the plurality of switches such that each of the plurality of switches opens or closes in response to the open/close state.

8. A semiconductor test apparatus as claimed in claim 7, wherein said first sequence memory stores the sequence pattern for each test mode for testing the device under test, and in case the test mode is changed, said first open/close state storage module holds the open/close instruction instructed by a last open/close instruction data of the sequence pattern before the test mode is changed, while the same data as the first open/close instruction data is consecutively retrieved from the time when the first open/close instruction data of the sequence pattern is retrieved after the test mode is changed.

9. A semiconductor test apparatus as claimed in claim 7, further comprising: a second sequence memory for storing a sequence pattern comprising open/close instruction data, which instructs to open/close other switch than said plurality of switches; a second address control module for sequentially retrieving each of the open/close instruction data of the sequence pattern from said second sequence memory in case an open/close state stored on said first open/close state storage module is changed; and a second open/close state storage module for storing an open/close state instructed by changed open/close instruction data in case the open/close instruction data, which instructs to open/close said other switch, retrieved by said second address control module is changed, wherein said other switch opens or closes in response to the open/close state stored by said second open/close state storage module provided for each of the other switch.

10. A machine readable medium storing thereon a program, which is executable by a processor, including instructions for generating a sequence pattern comprising open/close instruction data, which instructs to open/close a switch, output from a switch control apparatus to said switch, wherein said switch control apparatus comprises:
a sequence memory for recording a sequence pattern comprising open/close instruction data which instructs said switch thereon to open/close;
an address control module for sequentially retrieving each of the open/close instruction data of the sequence pattern from said sequence memory; and
an open/close state storage module for storing an open/close state instructed by changed open/close instruction data, when the open/close instruction data retrieved by said address control module is changed, and
wherein said computer program causes a computer to generate a sequence pattern comprising an open/close instruction data, which is different from an open/close instruction data output when said open/close state storage module starts opening or closing said switch, as an open/close instruction data output until said open/close state storage module starts opening or closing said switch from the time when said address control module starts retrieving the open/close instruction data of the sequence data.

* * * * *

UNITED STATES PATENT AND TRADEMARK OFFICE
CERTIFICATE OF CORRECTION

PATENT NO. : 7,395,477 B2  
APPLICATION NO. : 11/089053  
DATED : July 1, 2008  
INVENTOR(S) : Hiroyuki Kawashima et al.

It is certified that error appears in the above-identified patent and that said Letters Patent is hereby corrected as shown below:

On the Title Page:

On the title page, item [73] Assignee, "Avantest Corporation" should be

--Ad<u>v</u>antest Corporation--.

On the title page, please add item [74] Attorney, Agent or Firm – Osha Liang LLP.

Signed and Sealed this

First Day of September, 2009

David J. Kappos  
*Director of the United States Patent and Trademark Office*